US010665771B2

(12) United States Patent
Riihiaho (10) Patent No.: US 10,665,771 B2
(45) Date of Patent: May 26, 2020

(54) PIEZOELECTRIC SENSOR, A DEVICE AND A METHOD OF USING A PIEZO CHANNEL

(71) Applicant: AITO INTERACTIVE OY, Espoo (FI)

(72) Inventor: Jukka Riihiaho, Vantaa (FI)

(73) Assignee: AITO BV, Amsterdam (NL)

(*) Notice: Subject to any disclaimer, the term of this patent is extended or adjusted under 35 U.S.C. 154(b) by 386 days.

(21) Appl. No.: 15/525,470

(22) PCT Filed: Nov. 10, 2015

(86) PCT No.: PCT/EP2015/076193
§ 371 (c)(1),
(2) Date: May 9, 2017

(87) PCT Pub. No.: WO2016/075131
PCT Pub. Date: May 19, 2016

(65) Prior Publication Data
US 2017/0324020 A1     Nov. 9, 2017

(30) Foreign Application Priority Data
Nov. 10, 2014  (EP) ..................................... 14192448

(51) Int. Cl.
*H01L 41/08*   (2006.01)
*H01L 41/04*   (2006.01)
(Continued)

(52) U.S. Cl.
CPC .............. *H01L 41/08* (2013.01); *G06F 3/016* (2013.01); *G06F 3/048* (2013.01); *G06F 3/0414* (2013.01);
(Continued)

(58) Field of Classification Search
CPC ... H01L 41/08; H01L 41/042; H01L 41/1132; G06F 3/016; G06F 3/0414; G06F 3/048; G06F 3/042
(Continued)

(56) References Cited

U.S. PATENT DOCUMENTS 7,446,456 B2 * 11/2008 Maruyama .............. G06F 3/011
                                                    310/317
2011/0127880 A1   6/2011 Murphy et al.
(Continued)

FOREIGN PATENT DOCUMENTS

CN        102822775 A      12/2012
CN        103683516 A       3/2014
(Continued)

OTHER PUBLICATIONS

Jan. 8, 2019 Notice of Rejection from Japanese Patent Office (original and English translation).
(Continued)

*Primary Examiner* — Derek J Rosenau (57) ABSTRACT

A piezoelectric sensor comprises a microcontroller, a plurality of piezoelectric sensor elements of which at least two are useable for producing a haptic signal by a voltage (HV) generated by a boost converter connected to each piezoelectric sensor element, and connected to a piezo channel of the microcontroller. A multiplexer individually controls each of the switches if an enable a signal is present. The microcontroller is configured to use each of the piezo channels as a sensor channel for reading sensor input from the respective piezoelectric sensor element and in response to detecting a sensor input in at least one of the piezo channels to set the enable signal at the increase voltage pin and/or the enable signal pin, and to set a signal to at least one piezo channel in which the sensor input was detected.

6 Claims, 5 Drawing Sheets

(51) Int. Cl.
  *H03K 17/96* (2006.01)
  *G06F 3/01* (2006.01)
  *G06F 3/041* (2006.01)
  *G06F 3/048* (2013.01)
  *H01L 41/113* (2006.01)

(52) U.S. Cl.
  CPC ........ *H01L 41/042* (2013.01); *H01L 41/1132* (2013.01); *H03K 17/9643* (2013.01); *H03K 2217/96062* (2013.01)

(58) Field of Classification Search
  USPC ........................................ 310/314, 317, 338
  See application file for complete search history.

(56) References Cited

U.S. PATENT DOCUMENTS

| | | |
|---|---|---|
| 2011/1028250 | 6/2011 | Murphy et al. |
| 2013/0200871 A1 | 8/2013 | Sprentall |

FOREIGN PATENT DOCUMENTS

| | | |
|---|---|---|
| EP | 2770638 | 8/2014 |
| FR | 2846479 | 4/2004 |
| JP | 2011 002926 | 6/2011 |
| JP | 2011 048696 | 10/2011 |
| WO | 2016 075131 | 5/2016 |

OTHER PUBLICATIONS

International Search Report and Written Opinion for PCT Application PCT/EP2015/076193, EPO, dated Feb. 18, 2016.
Translation of office action from Japanese Patent Office in corresponding Japanese Patent Application 2017-543892 and dated Sep. 11, 2018.
Office Action dated Dec. 25, 2019 from National Intellectual Property Administration, P.R. China and Search Report in Chinese.
Office Action dated Dec. 25, 2019 from National Intellectual Property Administration, P.R. China and Search Report English Translation.

\* cited by examiner

PIEZOELECTRIC SENSOR, A DEVICE AND A METHOD OF USING A PIEZO CHANNEL

FIELD OF THE INVENTION

The invention relates to piezoelectric input sensors and to devices in which such piezoelectric sensors are used.

TECHNICAL BACKGROUND

European patent application of the present applicant published under publication number EP 2 770 637 A1 (the contents of which are incorporated herein by reference)—hereinafter the '637 publication—describes a piezoelectric switch circuit having at least one piezoelectric sensor element. FIG. 10 thereof has been redrawn as FIG. 1 of the present application and illustrates a piezoelectric switch circuit having two piezoelectric sensor elements.

The piezoelectric sensor elements of the piezoelectric switch circuit of the '637 publication and also that shown in FIG. 1 may be used not only to detect a signal resulting from bending of the piezoelectric sensor element due to it being subject to a force that results from pressure or force exerted (such as by a human finger) on a surface to which the piezoelectric sensor element has been attached from below the surface, but also to produce a haptic signal that can be sensed (such as by the human finger) through the surface.

OBJECTIVE OF THE INVENTION

A piezoelectric switch circuit configured to detect a signal resulting from bending of at least one piezoelectric sensor element being part of the circuit and also to produce a haptic signal, like the piezoelectric switch circuit disclosed in the '638 publication, where the haptic signal is produced by a boost converter (cf. FIG. 1: boost converter 1101 produces a high voltage that may be any voltage from some dozens of Volts to 200-400 Volts, and is preferably 100-200 Volts) by switching it over a piezoelectric sensor element. When the switch (cf. FIG. 1: switch 1105, I or switch 1105, II) is open, the respective piezoelectric sensor element (cf. FIG. 1: piezoelectric sensor element 20, I or 20, II, respectively) is usable as a touch switch. When one of the switches is closed, the respective piezoelectric sensor element is usable as a haptic signaling means. The switch is controlled by the microcontroller (cf. FIG. 1: microcontroller 26) by a signal (cf. FIG. 1: signal DRVEN1 or signal DRVEN2, respectively) via a pin (cf. FIG. 1: pin 52, I or pin 52, II, respectively).

It is understood that since each piezoelectric sensor element requires one microcontroller channel for reading sensor inputs and each piezoelectric sensor element that is used to produce a haptic signal requires a further microcontroller channel for switching the haptic signal, the number of channels required at the microcontroller will be rapidly increased with an increasing number of piezoelectric sensor elements used to produce a haptic signal. This is considered as a disadvantage.

It is an objective of the invention to simplify circuit design in the context of producing haptic signaling in a piezoelectric sensor comprising a plurality of piezoelectric sensors, of which at least two are useable for producing haptic signaling.

This objective can be fulfilled with the piezoelectric sensor according to claim 1, with the device comprising a piezoelectric sensor according to claim 6.

ADVANTAGES OF THE INVENTION

The piezoelectric sensor comprises a microcontroller, and a plurality of piezoelectric sensor elements of which at least two are a) useable for producing a haptic signal by a voltage generated by a boost converter connected to each piezoelectric sensor element via a respective switch, and b) connected to a piezo channel of the microcontroller.

The piezoelectric sensor further comprises a multiplexer for individually controlling each of the switches for which a signal is present at a digital selection line connected to the respective piezo channel, if a signal from an increase voltage pin is present.

The microcontroller is configured:

i) to use each of the piezo channels as a sensor channel for reading sensor input from the respective piezoelectric sensor element; and ii) in response to detecting a sensor input in at least one of the piezo channels, to set a signal at the increase voltage pin and/or the signal at the enale signal pin, and furthermore to set a signal to at least one piezo channel in which the sensor input was detected, for producing a haptic signal with the respective piezoelectric sensor element such that the signal will be set in a time-interleaved manner with respect to the sensor input.

The piezoelectric sensor enables a simplified circuit design with respect to the microcontroller, in which a piezo channel can be used both to collect sensor input from a piezoelectric sensor element and to set a signal to cause the multiplexer to effect the closing of the switch to generate haptic feedback at the same piezoelectric sensor.

If the piezo channel is connected to the piezoelectric sensor element for reading a signal resulting from bending of the piezoelectric sensor element, the same piezo channel can be shared for collecting the signal resulting from bending of the piezoelectric sensor and also for setting the signal to cause the multiplexer to effect the closing of the switch to generate haptic feedback at the same piezoelectric sensor.

The boost converter may be configured to produce the voltage if a signal generated by the microcontroller is present in the increase voltage pin and/or in the enable signal pin of the microcontroller. Alternatively, the boost converter may be configured to produce the voltage if a signal generated by a multiplexer function in the multiplexer is present. The signal can be derived from signal from the increase voltage pin of the microcontroller, in which case the signal at the enable signal pin is not necessarily needed at the microcontroller output.

Preferably, the microcontroller is configured to use the piezo channel in a time-interleaved manner for receiving sensor input from a piezoelectric sensor element and for giving output for a digital selection line to the multiplexer.

The device comprises a surface at least one a piezoelectric sensor according to the first aspect of the invention attached to the surface from below such that the at least one piezoelectric sensor is useable as a touch sensor through the surface and for producing haptic feedback through the surface.

LIST OF DRAWINGS

In the following, the invention will be explained in more detail with reference to the embodiments shown in FIGS. 3 to 4 of the attached drawings, of which.

Same reference numerals refer to same or similar structural elements in all FIG.

DETAILED DESCRIPTION

The exemplary embodiments of piezoelectric device 2' according to the present invention will be explained in detail with additions and amendments to piezoelectric device 2 disclosed in the '638 publication. For the sake of conciseness, the reader is referred to the '638 publication as regards the detailed explanation of any components and the respective circuitry not explicitly described in the following.

Furthermore, for the more detailed structure of device 1 and the arrangement of piezoelectric device 2' in the device 1, the reader is referred to FIG. 1 of the '638 publication and the respective parts of the description. It is to be understood that instead of piezoelectric device 2, piezoelectric device 2' is arranged in device 1. The structure of piezoelectric device 2' is most preferably the same as regards any of its other functions and implementation, except as regards the components and the respective circuitry that will be explicitly described in the following.

Figure 2A:
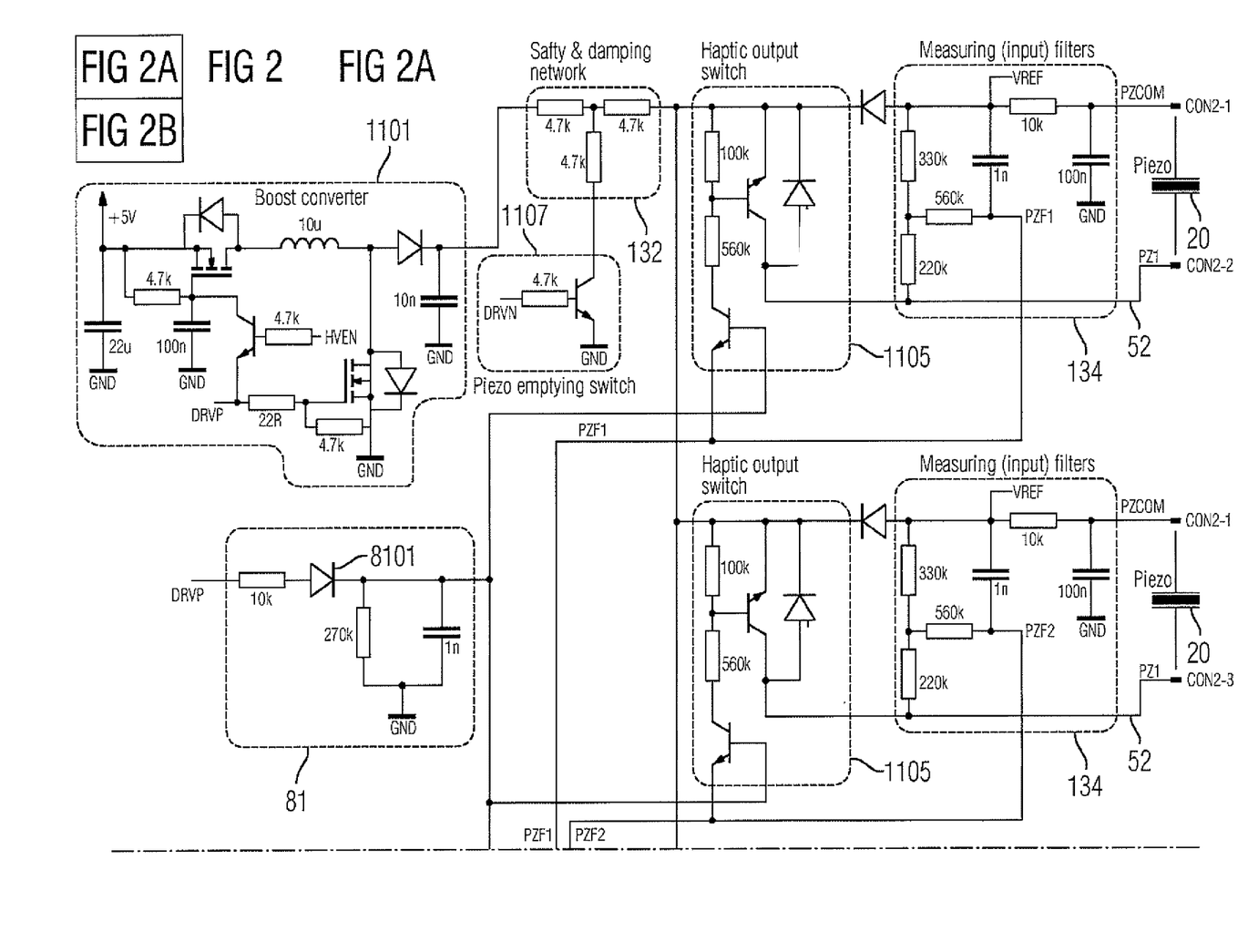
FIG. 2 is a detailed circuit diagram showing the components of the piezoelectric sensor according to the embodiment of the present invention.
Figure 2B:
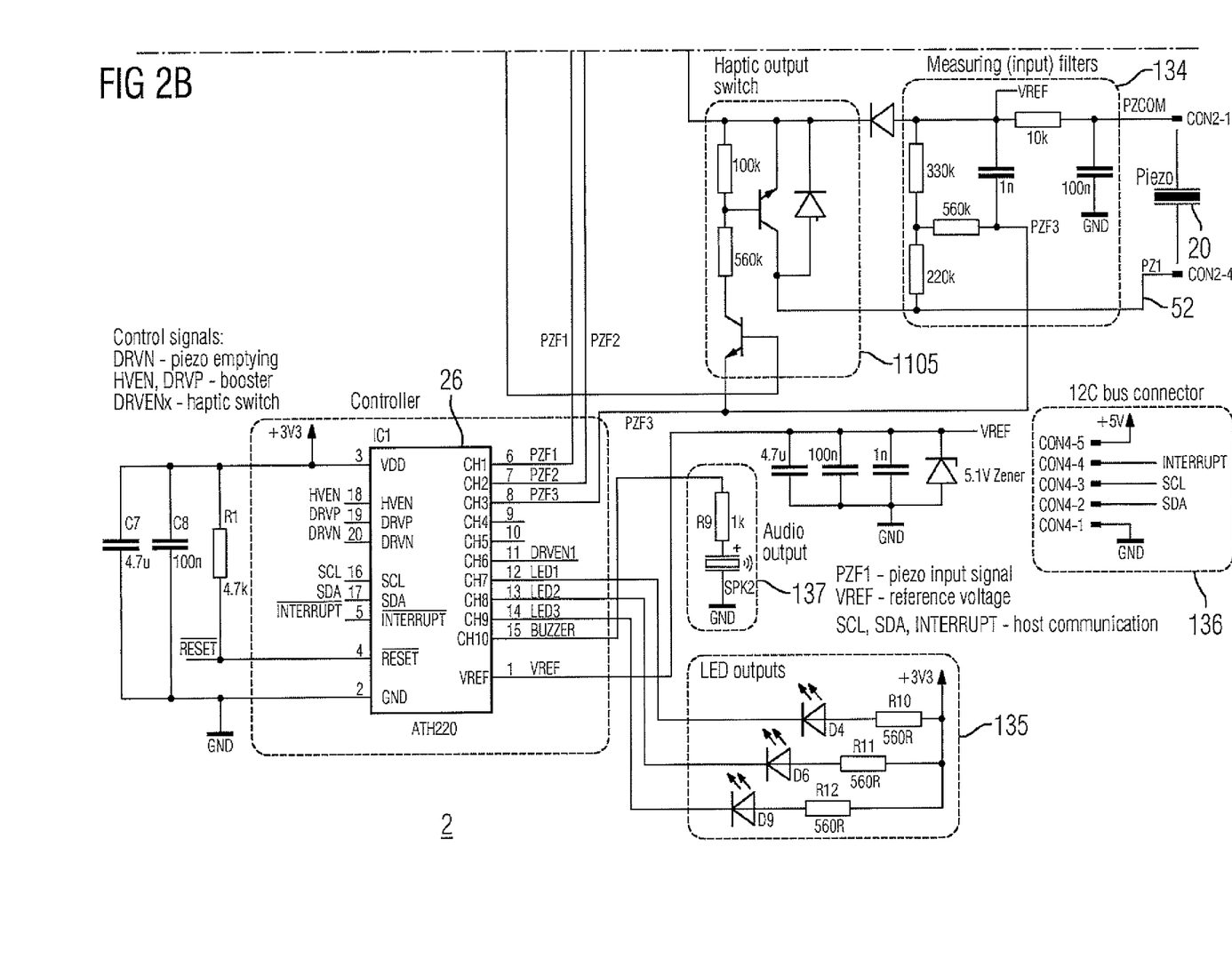

FIG. 2 illustrates FIG. 12 of the piezoelectric device 2 disclosed '638 publication but now having three haptic output switches 1105. As it can be understood, the number of haptic output switches 1105 increasing, the more microcontroller lines will be needed (now CH1 for PZF1, CH2 for PZF2 and CH3 for PZF3). Actually, the number of the haptic output channels may be chosen so that there will be one or more haptic output channels. In the implementation according to the '638 publication, the number of haptic output switches 1105 is equal to the number of haptic output channels.

Figure 1:
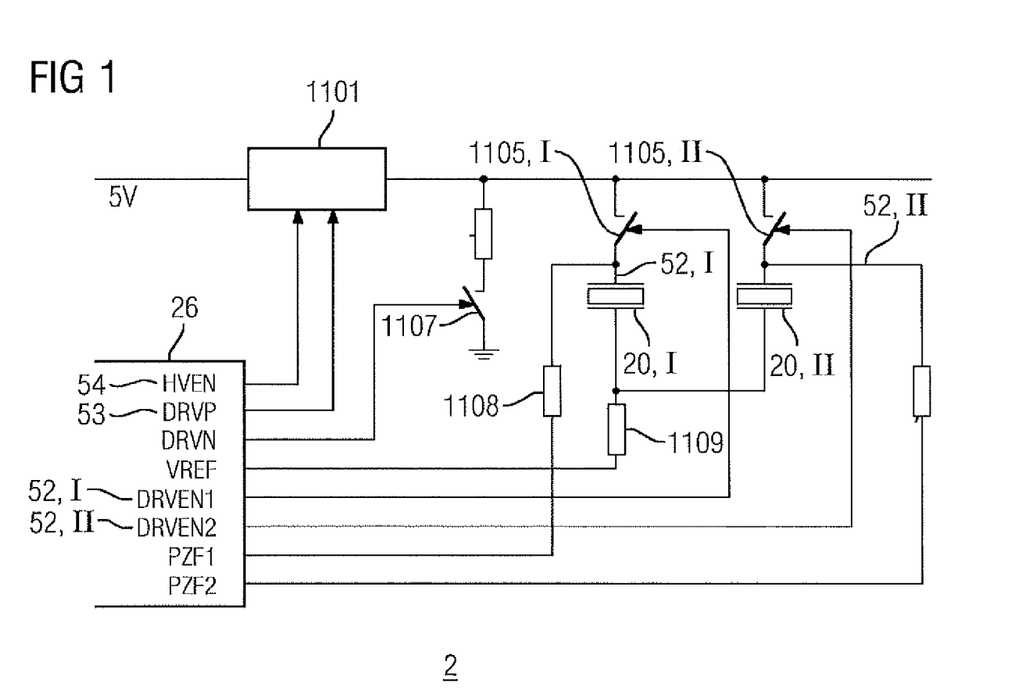
FIG. 1 is a simplified circuit showing certain components of the piezoelectric sensor according to state of the art.

As can be more easily understood from FIG. 1, each haptic output switch 1105 (such as haptic output switch 1105, I or haptic output switch 1105, II) must be controllable which requires a dedicated channel at microcontroller 26. When haptic output switch 1105 is closed, the high voltage (as defined in the background art section) generated by boost converter 1101 is connected over the respective piezoelectric sensor element 20 to make it vibrate for producing haptic feedback.

The fewer microcontroller 26 channels are needed for controlling switching of a haptic signal and for detection of signals from piezoelectric sensor elements 20, the more channels are available with the existing microcontroller 26 configurations.

The principle of operating the boost converter 1101 to produce a haptic signal is described in more detail with reference to FIG. 1. Voltage controlled haptic output switches 1105 (such as bipolar transistors or FETs) are controlled by voltage differences between microcontroller 26 (such as, PZ port pins) and on-board generated voltage (such as, HVEN). In typical use, for a single haptic channel, one of the PZ<i> pins is pulled down to 0V, and rest of the pins are pulled up to vdd (3.3V). The enable of the selection is made by the taking the generated voltage HVEN above the VBEon threshold voltage of the bipolar transistor (0.6V) with base node at HVEN. The transistor, which has emitter pulled down to 0V, conducts current, while the transistor(s) which have emitter(s) at vdd, are not conducting. The voltage value of HVEN can be anything between VBEon and vdd (3.3V) to ensure the selected channel conducts and the deselected channels do not. The pull-up of the deselected channels is not absolutely necessary: a HZ (analog input mode) state of the pins is enough to prevent the current flow, but in a noisy environment, the forced pull-up is safer.

Preferably, the HVEN signal is only activated when the DRVP has switching activity and toggles with logic part 81 (cf. FIG. 2) between lower and upper voltage. The voltage is rectified by switching element 8101 such as diode, to provide only positive control to the base of the transistor, to enhance the conductivity. When the switching at the DRVP ends, the base node of the selection transistors are drained to ground via the resistor, and all become non-conductive, regardless of the voltage of PZ pins.

The haptic channel selection is needed only during haptic booster upward drive, since the downward drive by transistor 1107 utilizes the HV switch diodes 1106 inside the haptic output switches 1105 to drain the charge from the PHZ<i> nodes.

The piezoelectric sensor 2' comprises a microcontroller 26 and a plurality of piezoelectric sensor elements 20, of which at least two are:

useable for producing a haptic signal by a voltage HV generated by a boost converter 1101 connected to each piezoelectric sensor element 20 via a respective switch 1105, and connected to a piezo channel (PZF1; PFZ2; PZF3, respectively) of the microcontroller 26.

The piezoelectric sensor 2' further comprises a multiplexer 80 for individually controlling each of the switches 1105 for which a signal is present at a digital selection line connected to the respective piezo channel (PZF1; PZF2; PZF3), if signal DRVP from increase voltage pin (53) is present.

The multiplexer 80 can be implemented as an array of individually controllable switches in the switching part 82. The logic part 81, electrically connected to the increase voltage pin 53 of the microcontroller 26, is configured to individually control the switches in the switching part 82 for which there is a signal present in the respective piezo channel (PZF1, PZF2, PZF3) and if the signal DRVP at the increase voltage pin 53 is present. Consequently, the signal in the respective piezo channel (PZF1, PZF2, PZF3) then controls the respective switch 1105.

The microcontroller 26 is configured:
i) to use each of the piezo channels (PZF1; PFZ2; PZF3) as a sensor channel for reading sensor input from the respective piezoelectric sensor element 20;
ii) in response to detecting a sensor input in at least one of the piezo channels (PZF1; PZF2; PZF3),
iia) to set signal DRVP at the increase voltage pin 53 and signal HVEN at the enable signal pin 54, and
iib) to set a signal to at least one piezo channel (PZF1; PZF2; PZF3) in which the sensor input was detected, for producing a haptic signal with the respective piezoelectric sensor element 20. The signal will be set with a short delay such that the signal at the at least one piezo channel (PZF1; PZF2; PZF3) will be set in a time-interleaved manner with respect to the sensor input.

The microcontroller 26 is configured to use the piezo channel (PZF1; PZF2; PZF3) in a time-interleaved manner for receiving sensor input from a piezoelectric sensor element 20 and for giving output for a digital selection line to the multiplexer 80.

Preferably, the piezo channel (PZF1; PZF2; PZF3) is connected to the piezoelectric sensor element 20 for reading a signal resulting from bending of the piezoelectric sensor element 20.

Figure 3:
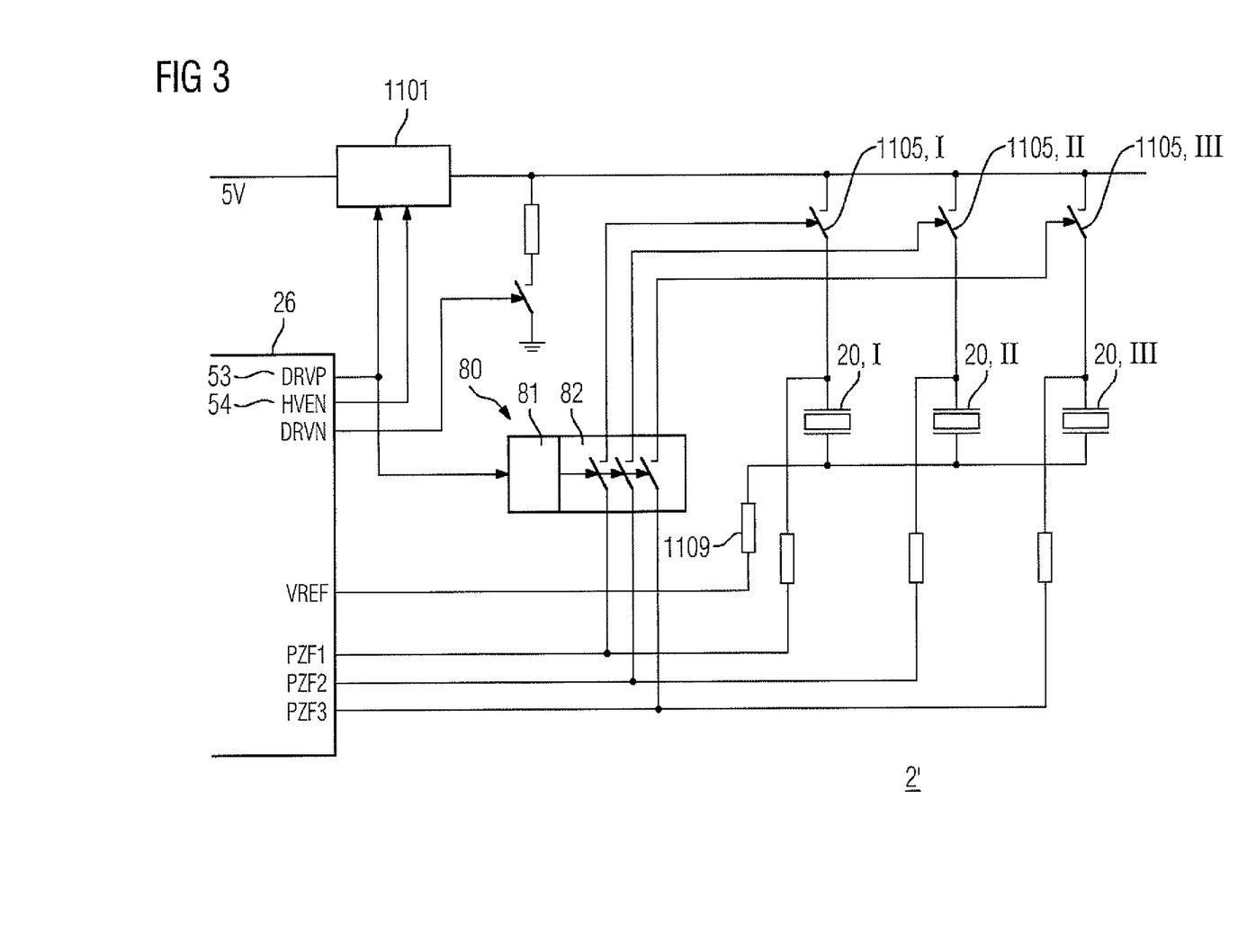
FIG. 3 is a simplified circuit showing certain components of the piezoelectric sensor according to a first embodiment of the present invention.

FIG. 3 illustrates the first embodiment of piezoelectric sensor 2'. Logic part 81 of multiplexer 80 is connected to increase voltage pin 53 of microcontroller 26. The increase voltage pin 53 is further connected to boost converter 1101.

Enable signal pin 54 of microcontroller 26 is connected to boost converter 1101. Boost converter 1101 produces a high voltage when signal HVEN is present in enable signal pin 54 and signal DRVP is present in increase voltage pin 53.

The multiplexer 80 is configured to operate its switching part 82 to trigger its output lines (going to haptic output switch 1105, I; 1105, II; 1105, III, respectively) in response to a signal in a respective input line (coming from PZF1, PZF2, PZF3, respectively) being present, if at the same time the increase voltage (DRVP) signal is present.

In the embodiment shown in FIG. 3, the boost converter 1101 is configured to produce the voltage HV if signal DRVP and/or signal HVEN generated by the microcontroller 26 is present.

Figure 4:
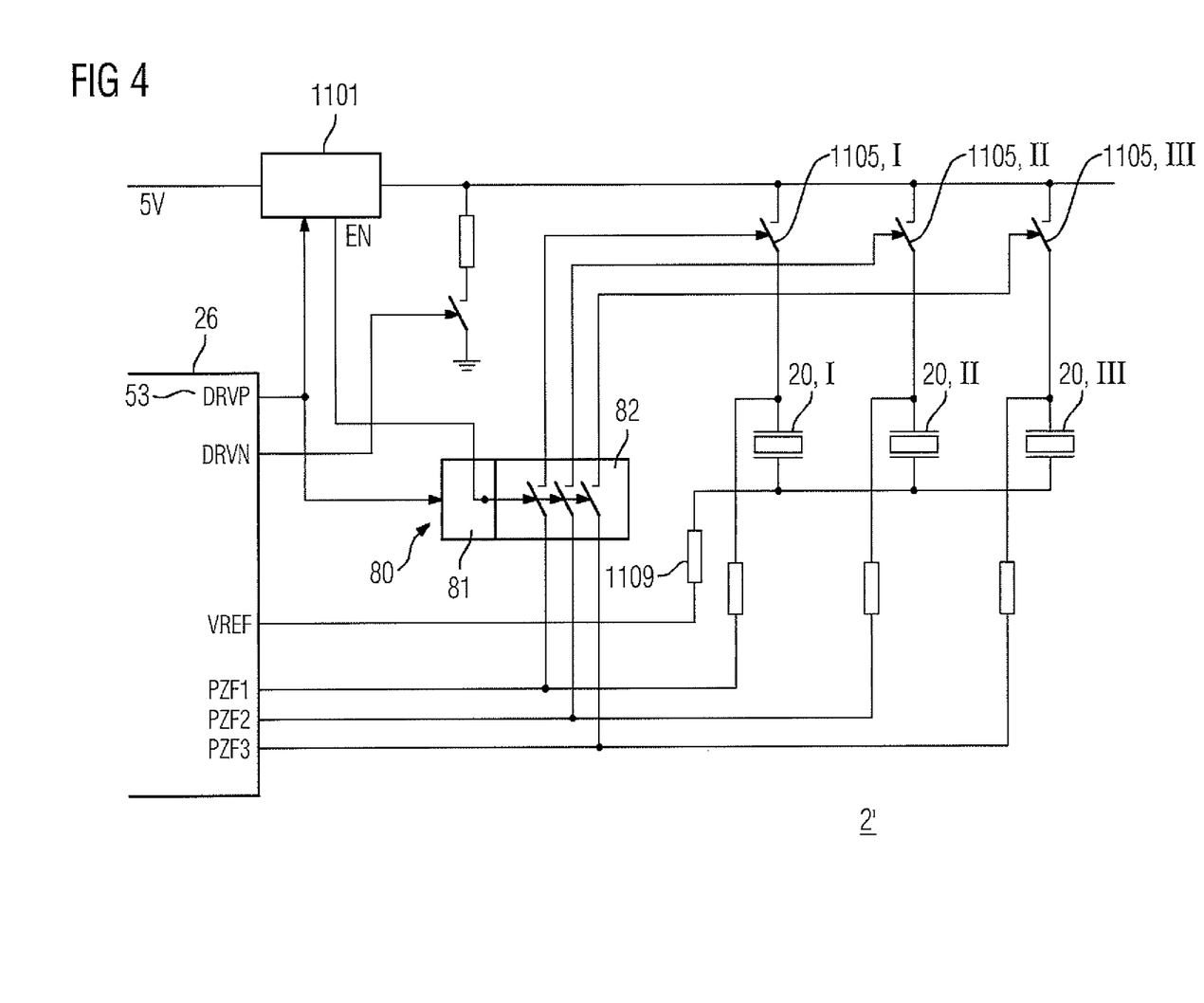
FIG. 4 is a simplified circuit showing certain components of the piezoelectric sensor according to a second embodiment of the present invention.

FIG. 4 shows an alternative embodiment of the piezoelectric sensor 2'. Now the enable signal pin 54 of the microcontroller 26 is not needed but the logic part 81 of multiplexer 80 is used also to derive signal EN from signal DRVP from the increase voltage pin 53 of the microcontroller 26. The signal EN is connected from an output of the logic part 81 of the multiplexer to the boost converter 1101. The boost converter 1101 is configured to produce voltage HV if the signal EN is present.

The advantage of the approach illustrated in FIG. 4 is that in this manner, the resource needs at the microcontroller 26 can be reduced since one digital output at the microcontroller 26 can be used for other purposes.

In yet another embodiment, an signal DRVP for both boost converter 1101 and multiplexer 80 can be generated with a suitable configuration of microcontroller 26. Signal HVEN is generated in enable signal pin 54 during upward drive. The signal HVEN can in this case be passed to both converter 1101 and multiplexer 80.

In the method of using a piezo channel (PZF1; PZF2; PZF3) of a microcontroller 26, the piezo channel (PZF1; PZF2; PZF3) is used
as a sensor channel for reading sensor input from at least one of a plurality of piezoelectric sensor elements 20, and
as a digital selection line to a multiplexer 80 to produce a haptic signal at the same piezoelectric sensor element 20 by a voltage HV generated by a boost converter 1101 connected to each piezoelectric sensor element 20 via a respective switch 1105.

The many features and advantages of the present invention are apparent from the written description. Further, since numerous modifications and changes will be readily apparent to those skilled in the art, the invention should not be limited to the exact construction and operation as illustrated and described. Hence, all suitable modifications and equivalents may be resorted to as falling within the scope of the invention.

In particular, the number of piezoelectric sensors 2' may be different from three. Furthermore, it is not necessary that each piezoelectric sensor 2' is configured so that a haptic signal can be switched over it.

LIST OF REFERENCE NUMERALS 1 device
2, 2' piezoelectric sensor
20 piezoelectric sensor element
26 microcontroller
52 drive channels
53 increase voltage pin
54 enable signal pin
80 multiplexer
81 logic part
82 switching part
132 safety & damping network
134 measuring (input) filters
135 LED outputs
136 I²C bus connector
137 audio output
1101 boost converter
1105 haptic output switch
1107 transistor
1108 resistor
1109 resistor
8101 switching element (e.g. diode)

The invention claimed is:

1. A piezoelectric sensor system (2') that comprises:
a microcontroller (26);
a plurality of piezoelectric sensor elements (20; 20, I; 20, II; 20, III) of which at least two of said plurality of piezoelectric sensor elements are:
configured for producing a haptic signal by a voltage (HV) generated by a boost converter (1101) connected to each piezoelectric sensor element (20; 20, I; 20, II; 20, III) via a respective switch (1105; 1105, I; 1105, II; 1105, III), and
connected to a piezo channel (PZF1; PFZ2; PZF3) of the microcontroller (26);
a multiplexer (80), responsive to the presence of a signal (DRVP) from increase voltage pin (53), for individually controlling each of the switches (1105; 1105, I; 1105, II; 1105, III) for which a signal is present at a digital selection line connected to the respective piezo channel (PZF1; PZF2; PZF3); and wherein the microcontroller (26) is configured:
i) to use each of the piezo channels (PZF1; PFZ2; PZF3) as a sensor channel for reading sensor input from the respective piezoelectric sensor element (20; 20, I; 20, II; 20, III); and
ii) in response to detecting a sensor input in at least one of the piezo channels (PZF1; PZF2; PZF3),
iia) to set the signal (DRVP) at the increase voltage pin (53) and/or the signal (HVEN) at the enable signal pin (54), and
iib) to set a signal to at least one piezo channel (PZF1; PZF2; PZF3) in which the sensor input was detected, for producing the haptic signal with the respective piezoelectric sensor element (20; 20, I; 20, II; 20, III) such that the signal will be set in a time-interleaved manner with respect to the sensor input.

2. The piezoelectric sensor system (2') according to claim 1, wherein: the piezo channel (PZF1; PZF2; PZF3) is connected to the piezoelectric sensor element (20, I; 20, II; 20, III) for reading a signal resulting from bending of one or more of the piezoelectric sensor elements (20, I; 20, II; 20, III).

3. The piezoelectric sensor system (2') according to claim 1, wherein said boost converter (1101) is configured to produce the voltage (HV) if a signal (DRVP, HVEN) generated by the microcontroller (26) is present at the increase voltage pin (53) and/or the enable signal pin (54).

4. The piezoelectric sensor system (2') according to claim 1, wherein said boost converter (1101) is configured to produce the voltage (HV) if the signal (EN) generated by a multiplexer function (82) in the multiplexer (80) is present.

5. The piezoelectric sensor system (2') according to claim 1, wherein: the microcontroller (26) is configured to use the piezo channel (PZF1; PZF2; PZF3) in a time-interleaved manner for receiving sensor input from a piezoelectric sensor element (20; 20, I; 20, II) and for giving output for a digital selection line to the multiplexer (80).

6. The piezoelectric sensor system (2') according to claim 1, further including a device comprising a surface, to which surface is attached from below at least one said piezoelectric sensor system (2') such that the at least one piezoelectric sensor system (2') is useable as a touch sensor through the surface and for producing haptic feedback through the surface.

\* \* \* \* \*